United States Patent
Ling et al.

(10) Patent No.: US 10,574,261 B2
(45) Date of Patent: Feb. 25, 2020

(54) SYSTEM AND METHOD FOR LOW-POWER DIGITAL SIGNAL PROCESSING

(71) Applicant: Maxlinear, Inc., Carlsbad, CA (US)

(72) Inventors: Curtis Ling, Carlsbad, CA (US); Jining Duan, Carlsbad, CA (US)

(73) Assignee: Maxlinear, Inc., Carlsbad, CA (US)

(*) Notice: Subject to any disclaimer, the term of this patent is extended or adjusted under 35 U.S.C. 154(b) by 0 days.

(21) Appl. No.: 15/997,183

(22) Filed: Jun. 4, 2018

(65) Prior Publication Data

US 2018/0278266 A1 Sep. 27, 2018

Related U.S. Application Data

(63) Continuation of application No. 15/587,534, filed on May 5, 2017, now Pat. No. 9,991,906, which is a continuation of application No. 15/082,989, filed on Mar. 28, 2016, now Pat. No. 9,647,687, which is a continuation of application No. 14/636,621, filed on Mar. 3, 2015, now Pat. No. 9,306,595, which is a continuation of application No. 14/243,679, filed on Apr. 2, 2014, now Pat. No. 8,981,977.

(60) Provisional application No. 61/807,462, filed on Apr. 2, 2013.

(51) Int. Cl.
| | | |
|---|---|---|
| H03M 7/30 | (2006.01) |
| H03M 7/46 | (2006.01) |
| H03M 7/40 | (2006.01) |
| H03M 1/00 | (2006.01) |
| H03M 1/66 | (2006.01) |

(52) U.S. Cl.
CPC ......... *H03M 7/6047* (2013.01); *H03M 1/002* (2013.01); *H03M 1/66* (2013.01); *H03M 7/40* (2013.01); *H03M 7/46* (2013.01)

(58) Field of Classification Search
CPC ...... H03M 7/6047; H03M 1/66; H03M 1/002; H03M 7/40
USPC .................................................. 341/155, 144
See application file for complete search history.

(56) References Cited

U.S. PATENT DOCUMENTS

| | | | |
|---|---|---|---|
| 7,193,553 B1 | 3/2007 | Bahai | |
| 7,313,380 B2 | 12/2007 | Yamaji | |
| 7,656,970 B1 | 2/2010 | Sankabathula et al. | |
| 7,949,319 B2 | 5/2011 | Tuttle | |
| 8,077,816 B2 | 12/2011 | Wong et al. | |
| 8,184,741 B2 * | 5/2012 | He | H04H 40/18 340/3.2 |
| 8,633,845 B2 * | 1/2014 | Standley | H03M 1/002 341/156 |
| 8,692,702 B2 * | 4/2014 | Nam | H03M 1/002 332/144 |
| 8,836,566 B2 * | 9/2014 | Kabir | H03M 1/002 341/158 |
| 8,981,977 B2 | 3/2015 | Ling et al. | |
| 9,306,595 B2 | 4/2016 | Ling et al. | |
| 9,647,687 B2 | 5/2017 | Ling et al. | |
| 9,991,906 B2 | 6/2018 | Ling et al. | |
| 2014/0292548 A1 | 10/2014 | Ling et al. | |
| 2015/0180505 A1 | 6/2015 | Ling et al. | |
| 2016/0211865 A1 | 7/2016 | Ling et al. | |

(Continued)

*Primary Examiner* — Brian K Young

(74) *Attorney, Agent, or Firm* — McAndrews, Held & Malloy, Ltd.

(57) ABSTRACT

A system and method for low-power digital signal processing, for example, comprising adjusting a digital representation of an input signal.

18 Claims, 9 Drawing Sheets

(56) References Cited

U.S. PATENT DOCUMENTS

2017/0244425 A1 8/2017 Ling et al.

\* cited by examiner

SYSTEM AND METHOD FOR LOW-POWER DIGITAL SIGNAL PROCESSING

CROSS-REFERENCE TO RELATED APPLICATIONS/INCORPORATION BY REFERENCE

This patent application is a CONTINUATION of U.S. patent application Ser. No. 15/587,534, filed May 5, 2017, titled "SYSTEM AND METHOD FOR LOW-POWER DIGITAL SIGNAL PROCESSING," issuing as U.S. Pat. No. 9,991,906; which is a CONTINUATION of U.S. patent application Ser. No. 15/082,989, filed Mar. 28, 2016, titled "SYSTEM AND METHOD FOR LOW-POWER DIGITAL SIGNAL PROCESSING," now U.S. Pat. No. 9,647,687; which is a CONTINUATION of U.S. patent application Ser. No. 14/636,621, filed Mar. 3, 2015, titled "SYSTEM AND METHOD FOR LOW-POWER DIGITAL SIGNAL PROCESSING," now U.S. Pat. No. 9,306,595; which is a CONTINUATION of U.S. patent application Ser. No. 14/243,679, filed Apr. 2, 2014, titled "SYSTEM AND METHOD FOR LOW-POWER DIGITAL SIGNAL PROCESSING," now U.S. Pat. No. 8,981,977; which is related to and claims priority from U.S. provisional patent application Ser. No. 61/807,462 filed Apr. 2, 2013, and titled "LOW-POWER DIGITAL SIGNAL PROCESSING," the contents of each of which are hereby incorporated herein by reference in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND OF THE INVENTION

Conventional methods and systems for processing digital signals consume too much power. Further limitations and disadvantages of conventional and traditional approaches will become apparent to one of skill in the art, through comparison of such systems with some aspects of the present invention as set forth in the remainder of the present application with reference to the drawings.

SUMMARY

Figure 1:
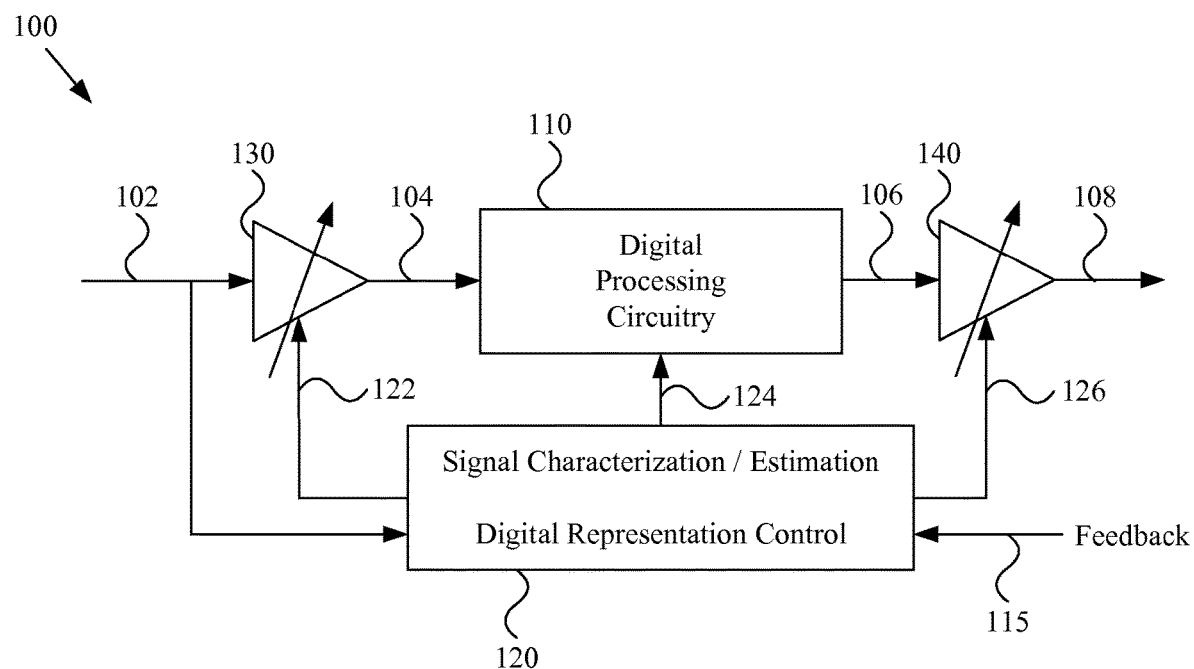
FIG. 1 is a diagram illustrating circuitry operable to control gain in a digital signal path for reducing power consumption, in accordance with various aspects of the disclosure.

Systems and methods are provided for low-power digital signal processing, substantially as shown in and/or described in connection with at least one of the figures, as set forth more completely in the claims.

Advantages, aspects and novel features of the present invention, as well as details of an illustrated embodiment thereof, will be more fully understood from the following description and drawings.

DETAILED DESCRIPTION OF VARIOUS ASPECTS OF THE DISCLOSURE

The following discussion will present various aspects of the present disclosure by providing various examples thereof. Such examples are non-limiting, and thus the scope of various aspects of the present disclosure should not necessarily be limited by any particular characteristics of the provided examples.

As utilized herein the terms "circuits" and "circuitry" refer to physical electronic components (i.e., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code.

As utilized herein, the phrases "for example," "exemplary," and "e.g." are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set $\{(x), (y), (x, y)\}$. As another example, "x, y, and/or z" means any element of the seven-element set $\{(x), (y), (z), (x, y), (x, z), (y, z), (x, y, z)\}$.

The following discussion will at times utilize the phrase "operable to," "operates to," and the like in discussing functionality performed by particular hardware, including hardware operating in accordance with software instructions. The phrase "operates to," "is operable to," and the like include "operates when enabled to". For example, a module that operates to perform a particular operation, but only after receiving a signal to enable such operation, is included by the phrases "operates to," "is operable to," and the like.

Present systems, for example digital signal processing systems, may generally consume more power than necessary during processing. At least a portion of unnecessary energy consumption is due to the manner in which digital bits are utilized to represent numbers and/or signal levels. For example, utilizing more bits than are necessary to represent a signal may lead to unnecessary bit state transitions during processing, which may consume electrical power unnecessarily. Also for example, representing numbers and/or signal levels in a manner that leads to unnecessary zero crossings during processing may also lead to unnecessary bit state transitions during processing, which may consume electrical power unnecessarily. Additionally for example, representing numbers and/or signal levels with a first fundamental type of digital value representation may lead to more bit transitions during processing relative to representing the numbers and/or signal levels with a second fundamental type of digital value representation.

Accordingly, various aspects of the present disclosure will provide examples of systems and/or methods for low-power digital signal processing that address at least the above-mentioned issues.

Turning first to FIG. 1, such figure is a diagram illustrating circuitry 100 operable to control gain in a digital signal path for reducing power consumption, in accordance with various aspects of the disclosure. The circuitry 100 comprises an input signal 102, a first amplifier (or attenuator) 130, a digital processing circuit 110, a second amplifier (or attenuator) 140, and an analysis/control circuit (or module) 120 that operates to analyze the quality of the input signal and control operation of the other circuit elements. Note that the discussion herein will generally utilize the terms "circuit" and "module" interchangeably. For example, a "module" may comprise electrical hardware, or may comprise a combination of electrical hardware and software, or may for example comprise a non-volatile computer-readable medium that store software instructions that when executed by a processor implemented a particular function.

The first amplifier 130 receives the input signal 102 and increases and/or decreases the magnitude of the input signal, outputting a first amplifier output signal 104. The first amplifier 130 amplifies (e.g., with a positive gain) or attenuates (e.g., with a negative gain) the input signal at a gain (positive or negative) that is controlled by a first amplifier control signal 122. The first amplifier 130 may, for example, receive a digital input signal 102 and apply a gain to the received input signal 102, where the gain may be positive or negative. Alternatively, the first amplifier 130 may comprise analog-to-digital circuitry that operates to receive an analog input signal 102, convert the analog input signal 102 to a digital output signal 104, and apply a particular controllable gain. Note, however, that in various aspects of the disclosure, the first amplifier need not apply any gain (e.g., a gain of 1).

The digital processing circuit 110, for example, receives as input the first amplifier output signal 104 and performs any of a variety of digital processing functions on the received signal 104. For example, the digital processing circuit 110 may perform filtering (e.g., finite impulse response (FIR) filtering, infinite impulse response (IIR) filtering, any of a variety of mathematical functions, any of a variety of logical functions, audio and/or video processing, communication signal processing, etc.). The digital processing circuit 110 outputs a digital processing circuit output signal 106, also referred to herein as a processed signal 106, which is provided to the second amplifier 140 as input.

The second amplifier 140 receives the digital processing circuit output signal 106 from the digital processing circuit 110 and increases and/or decreases the magnitude of the received signal, outputting a second amplifier output signal 108. The second amplifier 140 amplifies or attenuates the input signal at a gain (positive or negative) that is controlled by a second amplifier control signal 126.

The analysis/control circuit 120 may, for example, operate to monitor and/or estimate and/or analyze the input signal 102, for example to determine a quality level of the input signal 102. The analysis/control circuit 120 may, for example, receive the input signal 102 represented by a first digital representation. The analysis/control circuit 120 may, for example, analyze the received input signal 102 and/or signals related thereto and/or general signal environment to determine any of variety of measures of signal quality. For example, the analysis/control circuit 120 may analyze the input signal 102 to determine a signal-to-noise ratio (SNR), identify the existence of blocking signals, analyze eye pattern characteristics (e.g., eye opening and/or closure, etc.), etc. The analysis/control circuit 120 may also, for example, analyze the input signal 102 directly and/or receive one or more feedback signals 115 that include signal analysis information to determine an error rate for the signal 102 (e.g., bit error rate, frame error rate, etc.). The feedback signal(s) 115 may also, for example, comprise one or more signals indicating to the analysis/control circuit 120 whether to perform power-save operation (e.g., whether a user has authorized such operation, when a power supply is low enough to perform the power-save operation, whether the output quality to the user is good enough to allow the power-save operation, etc.). In general, the analysis/control circuit 120 may operate to determine a quality level for the input signal. Accordingly, the scope of various aspects of this disclosure should not be limited by characteristics of any particular type of quality measure of a signal nor by characteristics of any particular manner of determining a quality measure of a signal.

Further, the analysis/control circuit 120 may operate to analyze other characteristics of the input signal 102, for example the nature of the information being communicated by the input signal. For example, if the input signal 102 is a type of signal that communicates general data, it might be susceptible to random behavior that weighs against reducing a number of bits representing the signal. Also for example, if the input signal 102 is a type of signal that exhibits predictable behavior, the analysis/control circuit 120 can consider such predictability when determining whether to adjust the digital representation of the input signal 102.

Based at least in part on the analysis of the input signal 102 (e.g., a determination of one or more types of signal quality), the analysis/control circuit 120 may determine whether to adjust the digital representation of the input signal 102, for example prior to processing by the digital processing circuit 110. Various adjustment examples will be provided in the examples below. One of the goals of such adjusting may be to reduce power consumed in the digital processing circuit 110 and/or other circuits due to unnecessary bit state transitions.

If the analysis/control circuit 120 determines to perform an adjustment to the digital representation of the input signal 102, the analysis/control circuit 120 may then utilize control signals (e.g. a first amplifier control signal 122) to direct circuitry to perform the desired adjustment.

Additionally, if the analysis/control circuit 120 effects a change in the digital representation of the input signal 102, such a change may warrant a change in the manner in which the digital processing circuit 110 processes the adjusted input signal 102. For example, in an arithmetic example, factors may need to be adjusted to compensate for the change in the input signal 102. In another example, digital filter tap coefficients may also be modified to compensate for the adjusted input signal 102. In a scenario in which a change in the digital representation of the input signal 102 affects the manner in which the digital processing circuit 110 needs to operate, the analysis/control circuit 120 may provide a processing control signal 124 to the digital processing circuit 110 to notify the digital processing circuit 110 of the change in digital representation and/or direct the manner in which the digital processing circuit 110 performs its processing function.

The above discussion provided a general discussion of various aspects of the disclosure. Examples will now be presented to illustrate various aspects of the disclosure in more detail. It should be noted that the following examples are merely illustrative and that the various aspects of this disclosure should not be limited by the characteristics of the following examples.

Figure 2A:
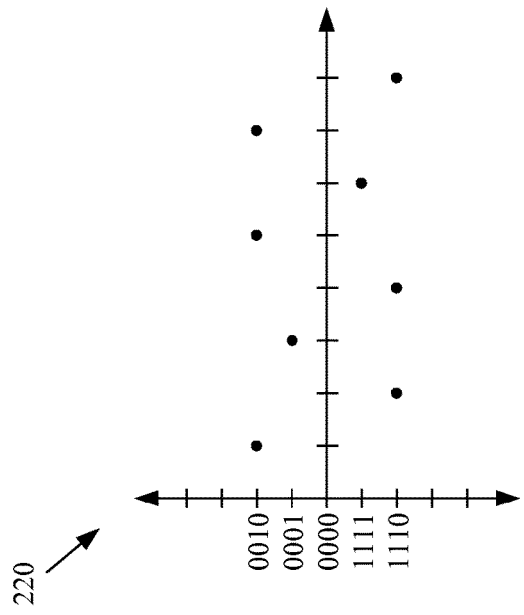
FIGS. 2A and 2B illustrate utilizing gain control for power savings, in accordance with various aspects of the disclosure.
Figure 2A:
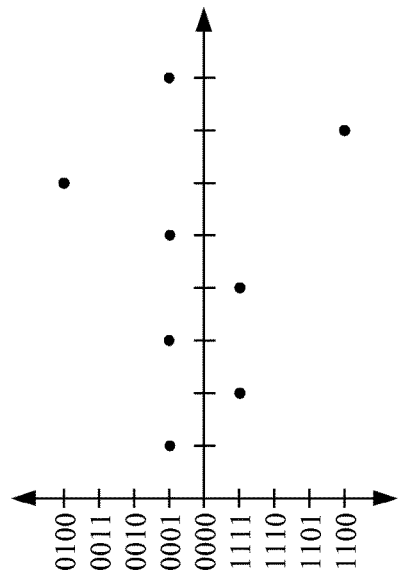

In a first example scenario, referring to FIGS. 1 and 2A, the input signal 102 is shown at graph 210. The analysis/control circuit 120 analyzes the SNR of the input signal 102 (and/or any other signal quality metric) and determines that the dynamic range of the input signal 102 can be decreased and fewer bits can be used to represent the input signal. As explained previously, using fewer bits may reduce energy wasted due to unnecessary bit state transitions. As part of its analysis, the analysis/control circuit 120 may, for example, compare a determined SNR and/or other quality metric to a threshold value that is associated with a change in digital representation of the input signal. Such a threshold value may, for example, be static or dynamic, for example adaptable in accordance with monitored circuit operation and power-saving. Such a threshold may, for example, shift based on absolute and/or relative time, desired quality, level of service purchased or guaranteed, power-saving settings (e.g., general settings and/or settings specifically related to the power-saving features discussed herein), a power-saving signal, a present state of power availability (e.g., plugged in, battery-operated, energy remaining in a finite power supply, device charging behavior, etc.), and the like.

Having made such determination, the analysis/control circuit 120 outputs a first amplifier control signal 122 to the first amplifier 130 directing the first amplifier 130 to reduce its gain. The gain-adjusted signal 104 output from the first amplifier 130 is shown at graph 220. Note that the signal 104 will be referred to as the gain-adjusted signal 104 for illustrative purposes, but it should be realized that the signal 104 might be passed through the first amplifier 130 without being gain-adjusted. As shown at graph 220, the most significant bit (MSB) of the digital representation is not utilized and may then be subject to no or significantly fewer bit state transitions during processing by the digital processing circuit 110, depending on the type of processing performed. In a scenario in which one or more bits (e.g., MSBs) of the digital representation are not utilized, they may be set to a particular value and/or locked to that value. In another example scenario, the adjustment of an MSB or other bit that is supposed to remain constant, for example by the digital processing circuit 110, may be used to trigger a re-evaluation of the signal and/or the signaling environment to determine whether a modification in the digital representation is warranted.

Another way of viewing the change in digital representation shown between graphs 210 and 220 is as a change in discrete step size in the digital representation. For example, the meaning of new value 0010 in graph 220 may be changed to have the same meaning as original value 0100.

Figure 2B:
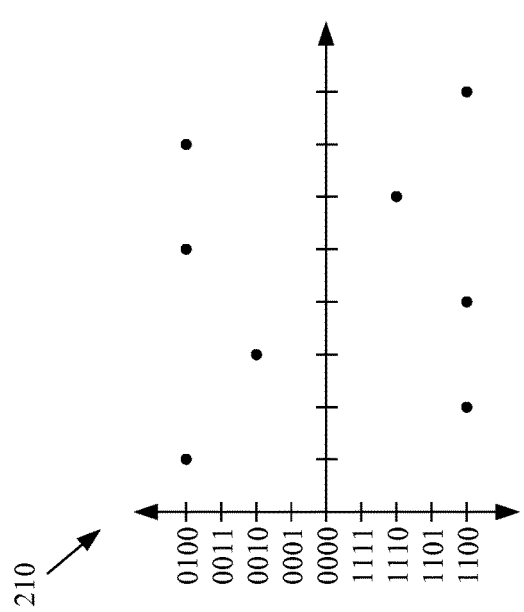
Figure 2B:
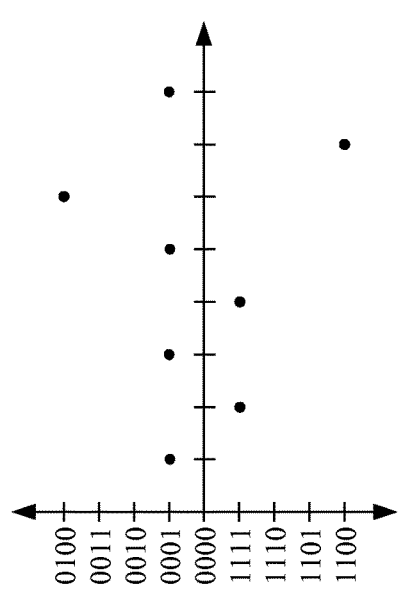

In an alternative scenario, as shown by graphs 260 and 270 in FIG. 2B, the analysis/control circuit 120 may determine that the SNR is too low, the error rate is too high, etc., to allow for a reduction in dynamic range. In such a scenario, the analysis/control circuit 120 may output a control signal 122 to the first amplifier 130 directing the first amplifier 130 to apply no gain to the input signal 102, resulting in an output so-called gain-adjusted signal 104 with no change in gain, as shown at graph 270.

Continuing the example, the output signal 104 from the first amplifier 130 as shown in graph 220 is input to the digital processing circuit 110. In this example, the digital processing circuit 110 may comprise an FIR filter having a plurality of taps with respective coefficients. As with the control signal 122 output to the first amplifier 130, the analysis/control circuit 120 may also output a processing control signal 124 to the digital processing circuit 110. The processing control signal 124 may, for example, notify the digital processing circuit 110 of the change in digital representation of the signal 104 input to the digital processing circuit 110. In such a scenario, the digital processing circuit 110 may adjust FIR filter tap coefficients (e.g., linearly) to compensate for the reduced dynamic range of the signal 104. In another scenario, the processing control signal 124 may specify the tap coefficients that the digital processing circuit 110 is to utilize. In a further example scenario, the processing control signal 124 may comprise memory address information of a particular processing subroutine that is to be executed by the digital processing circuit 110 to perform its processing.

After processing the gain-adjusted signal 104 input to the digital processing circuit 110, the digital processing circuit 110 may output a processed signal 106 comprising the results of the digital processing. The processed signal 106 is provided as an input to the second amplifier 140.

The second amplifier 140 may, for example, reverse the change in digital representation that was performed by the first amplifier 130 (e.g., applying reciprocal processing). For example, the second amplifier 140 may return gain that was previously removed by the first amplifier 130. The analysis/control circuit 120 may, for example, output a second amplifier control signal 126 to the second amplifier 140 directing the second amplifier 140 to return the gain that was previously removed by the first amplifier 130 (or alternatively return the modified discrete scaling to the original scaling). Such a signal change may, for example, be desirable for subsequent circuitry that does not have the power-save capability of the circuitry presented herein. For example, particular types of downstream signal processing circuitry like non-linear IIR circuitry might be provided with a signal represented in an original format for which the circuitry was designed. The second amplifier 140 may then output the gain-restored signal 108 (or second amplifier output signal 108).

The example discussed above generally included reducing the dynamic range of the input signal, for example to reduce the number of bits representing the input signal and thus minimize bit state transitions during following digital processing. A next example will focus on changing the fundamental type of digital representation (or number system), for example as opposed to a mere difference in degree, range magnitude, and/or range location.

Figure 3:
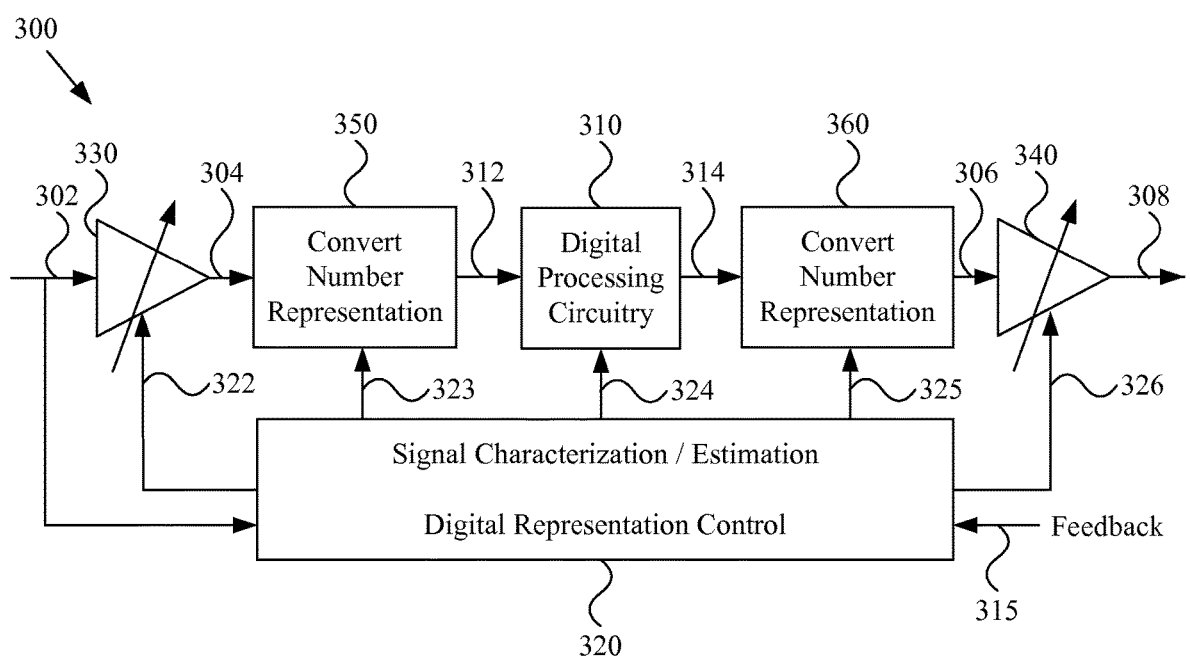
FIG. 3 is a diagram illustrating circuitry operable to convert between digital number representations for reducing power consumption, in accordance with various aspects of the disclosure.

Turning next to FIG. 3, such figure is a diagram illustrating circuitry 300 operable to convert between digital number representations for reducing power consumption, in accordance with various aspects of the disclosure. The circuit 300 may, for example, share any or all characteristics with the circuit 100 discussed above with regard to FIGS. 1-2.

For example, the circuit 300 comprises a first amplifier (or attenuator) 330 and a second amplifier (or attenuator) 340 that may share any or all characteristics with the first amplifier (or attenuator) 130 and second amplifier (or attenuator) 140 of the circuit 100 of FIG. 1. Also for example, the circuit 300 comprises a digital processing circuit 310 and an analysis/control circuit 320 that may share any or all characteristics with the digital processing circuit 110 and analysis/control circuit 120 of the circuit 100 of FIG. 1.

As mentioned previously, various aspects of this disclosure may comprise changing the fundamental type of digital representation of the input signal, as opposed to a mere change in degree, resolution, range, range location, etc. within a same fundamental type of digital representation. Examples of fundamental types of digital representations may comprise two's complement, binary coded decimal, offset binary, Excess-3, 4221 code, graph code, digital signed magnitude, thermometer code, multi-level logic, logarithmic numbering systems, residue number system, etc.

The analysis/control circuit 320 may, for example, analyze the input signal 302, general signal environment, other signals of the circuit, etc. as discussed above to determine whether to adjust the digital representation of the input signal 302. In the previous example shown in FIGS. 1-2, the determination included a determination of whether to adjust the dynamic range magnitude of the input signal. Additionally, or instead, the analysis/control circuit 320 may, for example, analyze the input signal 302 to determine whether to change the fundamental type of digital representation of the input signal. For example, for a particular type of signal, a first type of digital representation may result in fewer bit state transitions during a subsequent signal processing operation (e.g., filter processing, mathematical processing, general logic processing, etc.). In other words, a fundamental type of digital representation can be selected for the input signal 302 that minimizes wasted energy during subsequent digital processing activity. For example, for a signal communicating general data and a processing circuit performing general data processing, a first fundamental type of digital representation might be generally the most energy efficient. Also for example, for a signal communicating audio information and a processing circuit performing audio signal processing, a second fundamental type of digital representation might be the most energy efficient. Further for example, for a signal communicating still image information and a processing circuit performing still image processing, a third fundamental type of digital representation might be the most energy efficient. Still further for example, for a signal communicating moving picture information and a processing circuit performing moving picture processing, a fourth fundamental type of digital representation might be the most energy efficient.

In general, based at least in part on the analysis of the input signal 302 (e.g., a determination of one or more types of signal quality, type of information being communicated, type of processing to be performed on the signal, etc.), the analysis/control circuit 320 may determine whether to adjust the fundamental type of digital representation of the input signal 302, for example prior to processing by the digital processing circuit 310. As an example, in a scenario in which the fundamental type of digital representation of the input signal 302 is a two's complement representation, the processing of such a signal results in a significant number of sign changes (or zero-crossings) and causes a substantial number of bit state changes for what is often a relatively small magnitude change. In such a scenario, the analysis/control circuit 320 may determine that a signed magnitude number representation would save a substantial amount of energy by reducing a number of bit state transitions due to a zero crossing. The analysis may for example comprise analyzing a frequency of zero crossings, amount of oversampling used and/or needed, etc.

If the analysis/control circuit 320 determines to perform an adjustment to the fundamental type of digital representation of the input signal, the analysis/control circuit 320 may then utilize control lines to direct circuitry (e.g. a first number representation converter 350) to perform the desired adjustment. Note that this may also be combined with an adjustment in a number of bits representing the input signal (for example a dynamic range magnitude adjustment), which would be performed by the first amplifier (or attenuator) 330 in a manner as discussed above with regard to FIGS. 1-2. For example, the analysis/control circuit 320 may output a first amplifier control signal 322 to adjust the gain (e.g., a number of digital bits representing signal level) of the input signal 302, resulting in a gain-adjusted signal 304. The gain-adjusted signal 304 from the first amplifier 330 may then be provided to the first number representation converter 350. The analysis/control circuit 320 may then output a first number representation converter control signal 323 to the first number representation converter 350 to direct the first number representation converter 350 to adjust the fundamental type of digital representation of the gain-adjusted signal 304, resulting an output representation-type-adjusted signal 312. The digital processing circuit 310 then receives the representation-type-adjusted signal 312 as input and processes the signal accordingly, resulting in an output processed signal 314.

Additionally, if the analysis/control circuit 320 effects a change in the digital representation of the input signal 302, such a change may warrant a change in the manner in which the digital processing circuit 310 processes the adjusted input signal 302. For example, in an arithmetic example, factors may need to be adjusted to compensate for the change in the input signal 302. In another example, digital filter tap coefficients may also be modified to compensate for the adjusted input signal 302. In a scenario in which a change in the digital representation of the input signal 302 affects the manner in which the digital processing circuit 310 needs to operate, the analysis/control circuit 320 may provide a digital processing control signal 324 to the digital processing circuit 310 to notify the digital processing circuit 310 of the change in digital representation and/or direct the manner in which the digital processing circuit 310 performs its processing function.

Generally analogous to the previous discussion of FIGS. 1-2, in which the circuit utilized a second amplifier to reverse the change effected by the first amplifier 130, in FIG. 3 the circuit 300 may comprise a second number representation converter 360 to reverse the change made by the first number representation converter 350. For example, circuitry following the circuit 300 might have been designed to operate on a signal having a digital representation of the type originally existing at the input 302 to the circuit 300. In such a scenario, the analysis/control circuit 320 may output a second number representation converter control signal 325 to the second number representation converter 360 to direct the second number representation converter 360 to adjust the fundamental type of digital representation of the output signal 314 from the digital processing circuit 310, resulting an output representation-type-restored signal 306, which is provided to the second amplifier 340. Similarly, in a scenario in which the first amplifier 330 adjusted the gain of the input signal 302 (e.g., a number of bits representing the input signal 302), the analysis/control circuit 320 may output a second amplifier control signal 326 to restore the signal gain to that of the original input signal 302. The second amplifier 340 then adjusts the gain of the representation-type-restored signal 306, and outputs a gain-restored signal 308, which is provided to circuitry subsequent to the circuit 300.

In the example illustrated in FIG. 3, the first number representation converter 350 converts a first fundamental type of digital representation to another type. In a scenario in which a type of digital representation can be selected at the moment of digitization, there need not be a conversion since the selected digital representation is used from the outset. In other words, depending on the particular scenario, the first number representation converter 350 may be moved to the left in the circuit 300. In general, the first number representation converter 350 may be located in any of a variety of different circuit locations. In another example scenario, various range adjustments (e.g., range magnitude and/or range shifting operations) may be performed in the analog domain, for example prior to initial digitization.

As illustrated in FIG. 3, a change in the fundamental type of digital representation of the input signal may be combined with any or all other techniques discussed herein (e.g., dynamic range sizing, dynamic range moving, etc.). Alternatively for example, a change in the fundamental type of digital representation may be the only modification made.

The above discussion provided a general discussion of various aspects of the disclosure. Examples will now be presented to illustrate various aspects of the disclosure in more detail. It should be noted that the following examples are merely illustrative and that the various aspects of this disclosure should not be limited by the characteristics of the following examples.

Figure 4:
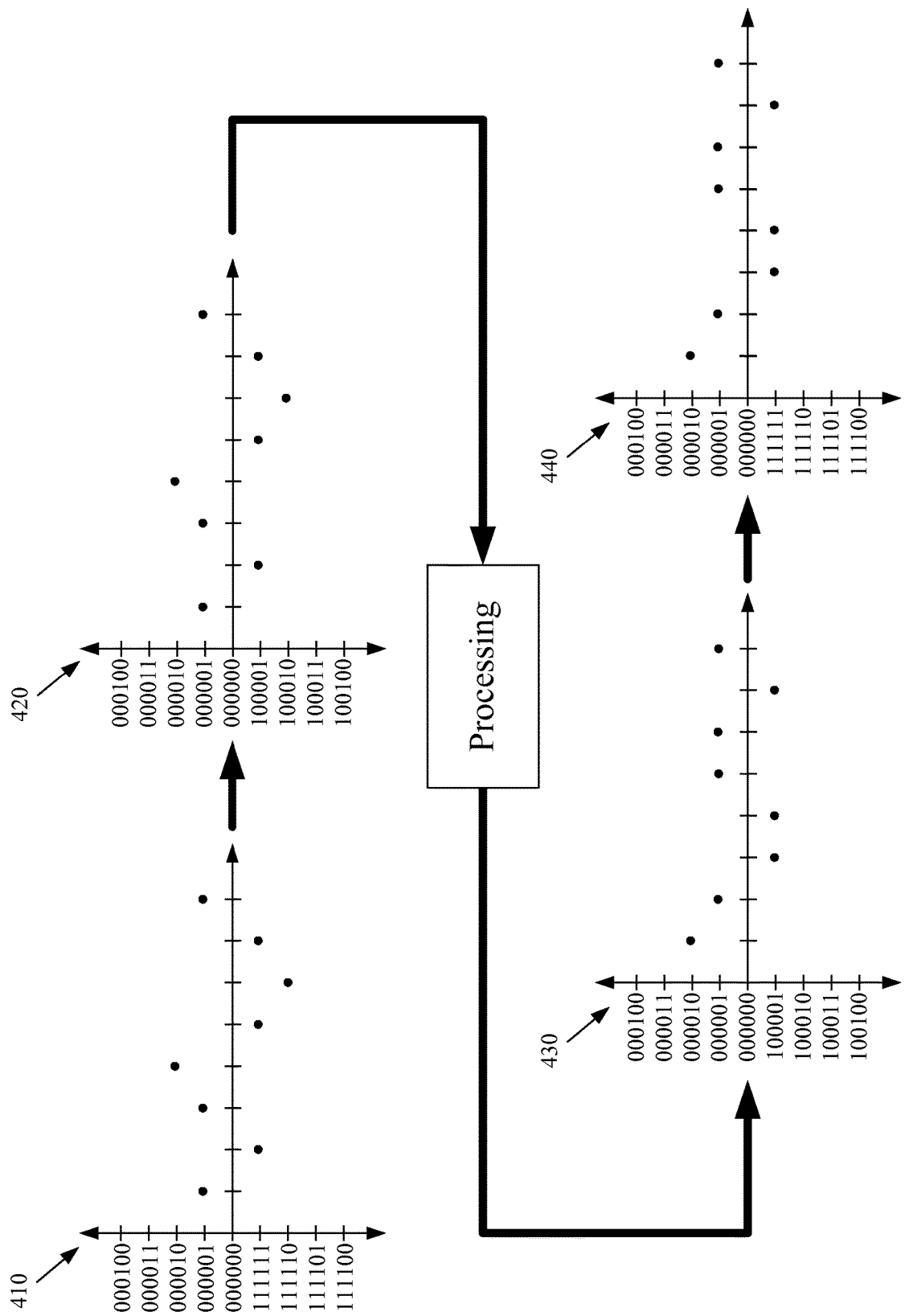
FIG. 4 illustrates utilizing number representation control for power savings, in accordance with various aspects of the disclosure.

In a first example scenario, referring to FIGS. 3 and 4, the input signal 302 is shown at graph 410. As shown by the digital values on the vertical axis, the input signal 302 is digitally represented in a two's complement fundamental type of digital representation. The analysis/control circuit 320 analyzes the error rate of the input signal 302 (and/or any other signal quality metric) and determines that the dynamic range of the input signal 302 will be left unchanged and that the fundamental type of digital representation will be changed to a signed magnitude type of digital representation. As explained previously, using a two's complement type of digital representation may result in a relatively large amount of bit state transitions in the presence of zero crossings. As part of its analysis, the analysis/control circuit 320 may, for example, compare a determined error rate and/or other quality metric to a threshold value that is associated with a change in digital representation of the input signal.

Having made such determination, the analysis/control circuit 320 outputs a first amplifier control signal 322 to the first amplifier 330 directing the first amplifier 330 to maintain or adjust its present gain (e.g., maintain or adjust a number of bits in the representation and/or the magnitudes that the bits represent), outputting a gain-adjusted signal 304. The analysis/control circuit 320 also outputs a first number representation converter control signal 323 to the first number representation converter 350 directing the first number representation converter 350 to change the fundamental type of digital representation of the signal 304 from a two's complement type of digital representation to a signed magnitude type of digital representation. The first number representation converter 350 than outputs the resulting representation-type-adjusted signal 312 in signed magnitude format as shown at graph 420. As shown at graph 420 compared to graph 410, in general, crossing the zero axis when using the signed magnitude format shown at graph 420 results in substantially fewer bit transitions relative to crossing the zero axis when using the two's complement format shown in graph 410. Note that as discussed previously, the number of zero crossings expected for a particular type of digital representation may also depend on the nature of the processing to be performed by the digital processing circuit 310.

Continuing the example, the representation-type-adjusted signal 312 from the first number representation converter 350 as shown in graph 420 is input to the digital processing circuit 310. In this example, the digital processing circuit 310 may comprise an audio and/or video processing circuit. As with the control signals 322 and 323 output to the first amplifier 330 and first number representation converter 350, the analysis/control circuit 320 may also output a processing control signal 324 to the digital processing circuit 310. The processing control signal 324 may, for example, notify the digital processing circuit 310 of the change in fundamental type of digital representation of the signal 312 input to the digital processing circuit 310. In such a scenario, the digital processing circuit 310 may adjust audio signal processing settings to compensate for the digital format change of the signal 312. In another scenario, the processing control signal 324 may specify the processing coefficients that the digital processing circuit 310 is to utilize. In a further scenario, the processing control signal 324 may comprise memory address information of a particular processing subroutine that is to be executed by the digital processing circuit 320 to perform its processing.

After processing the signal 312 input to the digital processing circuit 310, the digital processing circuit 310 may output a processed signal 314 comprising the results of the digital processing. An example of the processed signal 314 is shown at graph 430, which is represented in the same signed magnitude type of digital representation as the input signal 312 to the digital processing circuit 310. The processed signal 314 is provided as an input to the second number representation converter 360. The second number representation converter 360 may then, for example, reverse the change in digital representation that was performed by the first number representation controller 350. For example, the second number representation converter 360 may return the digital representation of the signal 314 to a two's complement type of digital representation. The analysis/control circuit 320 may, for example, output a second number representation controller control signal 325 to the second number representation converter 360 directing the second number representation converter 360 to return the fundamental type of digital representation of the signal 314 to the two's complement type of digital representation. Such a signal change may, for example, be desirable for subsequent circuitry that does not have the power-save capability of the circuitry presented herein. For example, particular types of downstream signal processing circuitry like non-linear IIR circuitry might be provided with a signal represented in an original format for which the circuitry was designed. The second number representation converter 360 may then output the representation-type-restored signal 306. An example of the representation-type-restored signal 306 is shown at graph 440, which is in the same two's complement type of digital representation as the gain-adjusted signal 304 input to the first number representation converter 350 and as the input signal 302 to the circuit 300.

The representation-type-restored signal 306 is then input to the second amplifier 340. The second amplifier 340 may, for example, reverse the change (if any) in digital representation that was performed by the first amplifier 340. For example, the second amplifier 340 may return gain that was previously removed by the first amplifier 330. The analysis/control circuit 320 may, for example, output a second amplifier control signal 326 to the second amplifier 340 directing the second amplifier 340 to return the gain that was previously removed (or for example return the modified discrete scaling to the original scaling). Such a signal change may, for example, be desirable for subsequent circuitry that does not have the power-save capability of the circuitry presented herein. For example, particular types of signal processing circuitry like non-linear IIR circuitry might be provided with a signal represented in an original format for which the circuitry was designed. The second amplifier 340 then outputs the gain-restored signal 308.

The example discussed above generally included changing the fundamental type of digital representation used to digitally represent a signal being processed, for example to reduce the number of bit state transitions occurring during digital processing. Additionally, the example also included changing the dynamic range of the input signal to reduce the number of bits representing the input signal and thus minimize bit state transitions during the digital processing. A next example will focus on shifting the dynamic range of the input signal, for example to reduce a number of bit transitions due to sign changes during digital processing.

Figure 5:
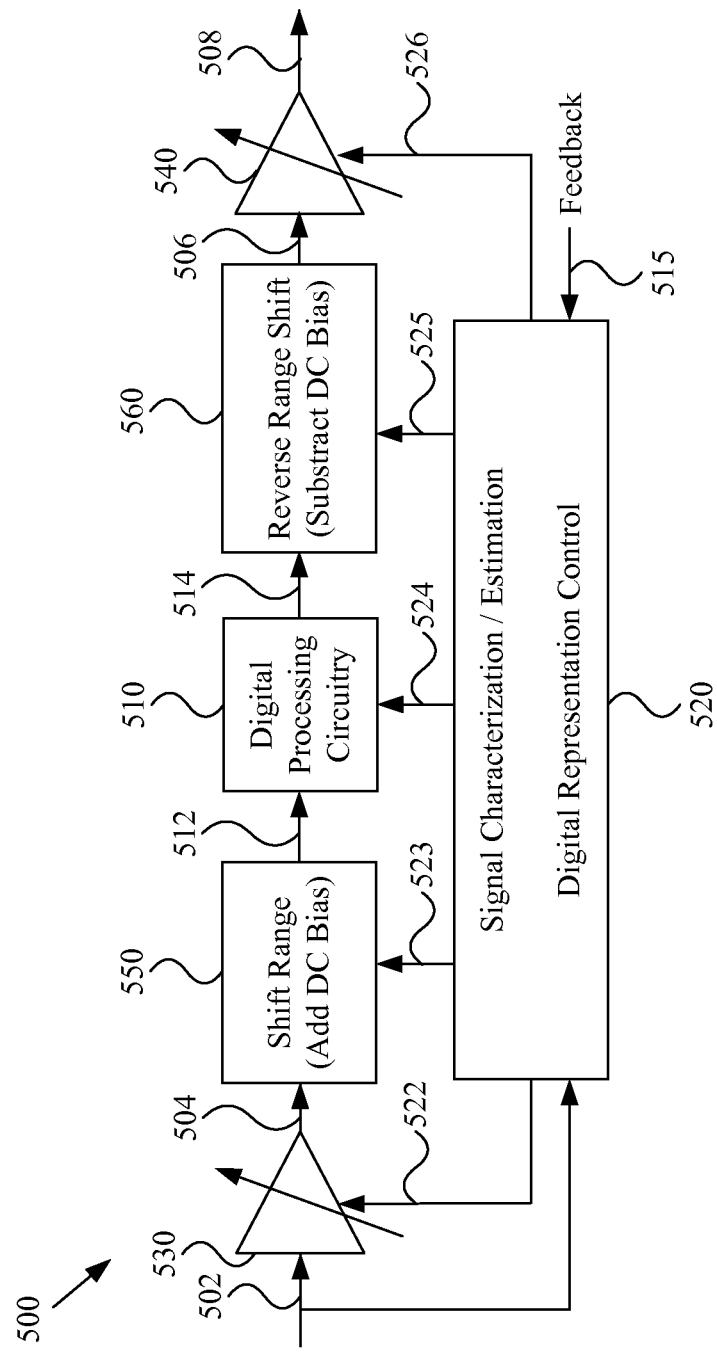
FIG. 5 is a diagram illustrating circuitry operable to introduce a DC bias for reducing power consumption, in accordance with various aspects of the disclosure.

Turning next to FIG. 5, such figure is a diagram illustrating a circuit 500 operable to introduce a DC bias for reducing power consumption, in accordance with various aspects of the disclosure. The circuit 500 may, for example, share any or all characteristics with the circuits 100 and 300 discussed above with regard to FIGS. 1-4.

For example, the circuit 500 comprises a first amplifier (or attenuator) 530 and a second amplifier (or attenuator) 540 that may share any or all characteristics with the first amplifier (or attenuator) 130, 330 and second amplifier (or attenuator) 140, 340 of the circuits 100, 300 of FIGS. 1 and 3. Also for example, the circuit 500 comprises a digital processing circuit 510 and an analysis/control circuit 520 that may share any or all characteristics with the digital processing circuit 110, 310 and analysis/control circuit 120, 320 of the circuits 100, 300 of FIGS. 1 and 3.

As mentioned previously, various aspects of this disclosure may comprise moving (or shifting) a location of a range (e.g., a signal's dynamic range) within a digital signal representation. This may also be viewed, for example, as adding a DC offset to a signal. For example, providing there is enough headroom in the digital representation, to avoid unnecessary bit transitions associated with zero crossings (e.g., swinging from positive to negative and vice versa), a digital representation of a signal (or number) that has both positive and negative values may be shifted positive so that it has only positive values, or may be shifted negative so that it has only negative values.

The analysis/control circuit 520 may, for example, analyze the input signal 502, and/or related signals, as discussed above to determine whether to adjust the digital representation of the input signal 502. In the previous examples shown in FIGS. 1-2 and in FIGS. 3-4, the determination included a determination of whether to adjust the dynamic range magnitude of the input signal and/or a determination of whether to adjust the fundamental type of digital representation of the input signal. Additionally, or instead, the analysis/control circuit 520 may, for example, analyze the input signal and/or related signals to determine whether to shift the digital representation of the input signal, for example in a positive or negative direction.

In general, based at least in part on the analysis of the input signal 502 (e.g., a determination of one or more types of signal quality, type of information being communicated, type of processing to be performed on the signal, etc.), the analysis/control circuit 520 may determine whether to shift the range of the input signal 502, for example prior to processing by the digital processing circuit 510. As an example, in a scenario in which 5 bits of information are being used to represent a signal that swings positive and negative, and in which 8 bits are available to represent the signal, if the digital processing to be performed on the signal is not going to utilize one or more of the most significant bits of the digital representation, the signal may be shifted so that the entire signal (or most of the entire signal) is positive or negative (e.g., by shifting the signal by an amount corresponding to one or more of the MSBs, or less). Note that the entire representation does not need to be all positive or all negative to significantly reduce the frequency of zero crossings and thus realize a power-saving benefit. For example, the range may be shifted so that most of the values have a same sign, so that 75% of the values have the same sign, so that 85% of the values have the same sign, etc.

In determining whether to shift the range of the input signal 502, the analysis/control circuit 520 may analyze the input signal 302 (e.g., actual and/or expected values thereof) and the subsequent processing to be performed on the input signal, and determine whether there is enough headroom in the digital representation such that the range of the signal can be shifted (or a DC offset added thereto) to reduce or eliminate zero crossings and without causing clipping near the limits of the signal.

In an example scenario, for example where a signal (either originally or as reduced in gain) has a dynamic range of less than 6 dB and at least 6 dB of headroom (before clipping would occur), a DC bias equal to ⅛ full swing may be added to the signal (equivalent to setting the MSB to '1') such that the signal no longer crosses zero and also doesn't clip. Gain/attenuation may be coordinated along with the bias in order to prevent or reduce zero crossings, toggling of bits (e.g., bit MSB-1), and/or signal clipping. Similarly, where the reduced-gain/attenuated signal has a dynamic range of less than 12 dB and at least 12 dB of headroom (before clipping would occur), a DC bias equal to ¼ full swing may be added to the signal (equivalent to setting two MSBs to '11') such that the signal no longer crosses zero and also doesn't clip. Gain/attenuation may be coordinated along with the bias in order to prevent or reduce zero crossings, toggling of bits (e.g., bit MSB-2), and/or signal clipping.

As mentioned above, the various power-saving techniques discussed herein may be combined. For example, the magnitude of the dynamic range of the input signal 502 may be reduced, followed by shifting the reduced dynamic range. Such a technique may, for example, reduce the possibility of signal clipping caused by the range shift.

If the analysis/control circuit 520 determines to shift the range of the input signal 502 the analysis/control circuit 520 may then utilize control lines to direct circuitry (e.g. a first range shifter 550) to perform the desired adjustment. As mentioned above, such a shift may also be combined with an adjustment in a number of bits representing the input signal (for example a dynamic range magnitude adjustment), which would be performed by the first amplifier (or attenuator) 530 in a manner as discussed above with regard to FIGS. 1-2 and with regard to FIGS. 3-4. For example, the analysis/control circuit 520 may output a first amplifier control signal 522 to adjust the gain (e.g., a number of digital bits representing signal level) of the input signal 502, resulting in a gain-adjusted signal 504. The gain-adjusted signal 504 from the first amplifier 530 may then be provided to the first range shifter 550. The analysis/control circuit 520 may then output a first range shifter control signal 523 to the first range shifter 550 to direct the first range shifter 550 to shift the range (e.g., the dynamic range) of the gain-adjusted signal 504, resulting in a range-shifted signal 512. The digital processing circuit 510 then receives the range-shifted signal 512 as input and processes the signal accordingly, resulting in an output processed signal 514.

Additionally, if the analysis/control circuit 520 effects a change in the digital representation of the input signal 502, such a change may warrant a change in the manner in which the digital processing circuit 510 processes the adjusted input signal 502. For example, in an arithmetic example, factors may need to be adjusted to compensate for the change in the input signal 502. In another example, digital filter tap coefficients may also be modified to compensate for the adjusted input signal 502. In a scenario in which a change in the digital representation of the input signal 502 affects the manner in which the digital processing circuit 510 needs to operate, the analysis/control circuit 520 may provide a digital processing control signal 524 to the digital processing circuit 510 to notify the digital processing circuit 510 of the change in digital representation and/or direct the manner in which the digital processing circuit 510 performs its processing function. In another example scenario, tap coefficients (e.g., in an FIR filter) may be set to positive numbers followed by a negating of the result after the multiplication, and thus save additional power.

Generally analogous to the previous discussion of FIGS. 1-2 and of FIGS. 3-4, in which the circuit utilized a second amplifier to reverse the change effected by the first amplifier, in FIG. 5 the circuit 500 may comprise a second range shifter 560 to reverse the change made by the first range shifter 550. For example, circuitry following the circuit 500 might have been designed to operate on a signal having a dynamic range of the type originally existing at the input 502 to the circuit 500. In such a scenario, the analysis/control circuit 520 may output a second range shifter control signal 525 to the second range shifter 560 to direct the second range shifter 560 to adjust the range of the output signal 514 from the digital processing circuit 510, resulting in an output range-shift-restored signal 506, which is provided to the second amplifier 540. Similarly, in a scenario in which the first amplifier 530 adjusted the gain of the input signal 502 (e.g., a number of bits representing the input signal 502), the analysis/control circuit 520 may output a second amplifier control signal 526 to the second amplifier 540 to restore the signal gain to that of the original input signal 502. The second amplifier 540 then adjusts the gain of the range-shift-restored signal 506, and outputs a gain-restored signal 508, which may be provided to circuitry subsequent to the circuit 500.

In the example illustrated in FIG. 5, the first range shifter 550 shifts or offsets a first range to another location. In a scenario in which a type of digital representation can be selected at the moment of digitization, there need not be a conversion since the selected digital representation is used from the outset. In other words, depending on the particular scenario, the first range shifter 550 may be moved to the left in the circuit 500. In general, the first range shifter 550 may be located in any of a variety of different circuit locations.

As illustrated in FIG. 5, a change in the range location of digital representation of the input signal may be combined with any or all other techniques discussed herein (e.g., dynamic range sizing, a change in fundamental type of digital representation, etc.). Alternatively for example, a shift in the range location may be the only modification made.

The above discussion provided a general discussion of various aspects of the disclosure. Examples will now be presented to illustrate various aspects of the disclosure in more detail. It should be noted that the following examples are merely illustrative and that the various aspects of this disclosure should not be limited by the characteristics of the following examples.

Figure 6:
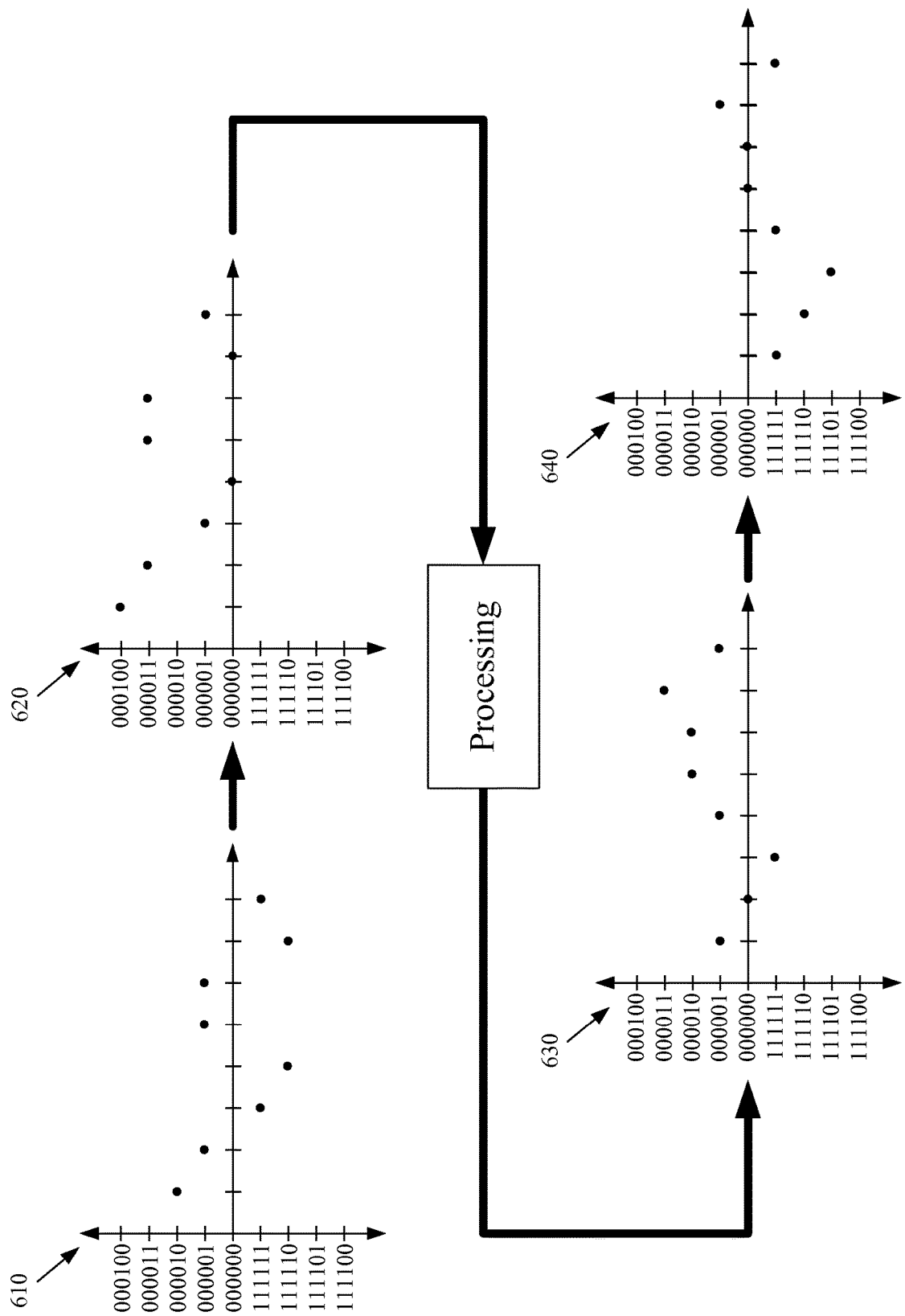
FIG. 6 illustrates utilizing DC bias control for power savings, in accordance with various aspects of the disclosure.

In a first example scenario, referring to FIGS. 5 and 6, the input signal 502 is shown at graph 610. The analysis/control circuit 520 analyzes the error rate of the input signal 502 (and/or any other signal quality metric), the present range size, the present range magnitude, the digital processing to be performed on the input signal 502, etc., and determines that the dynamic range of the input signal 502 will be left unchanged and that the range of the input signal 502 will be shifted positively to eliminate and/or reduce zero crossings in the digital processing. As explained previously, shifting the range of the input signal 502 may eliminate and/or reduce a substantial amount of unnecessary bit state transitions due to zero crossings. As part of its analysis, the analysis/control circuit 520 may, for example, compare a determined error rate and/or other quality metric to a threshold value that is associated with a change in digital representation of the input signal. Also as mentioned previously, the analysis/control circuit 520 may also determine whether there is enough headroom to shift the range and/or determine the amount of a range shift to avoid clipping during digital processing of the signal by the digital processing circuit 510.

Having made such determination, the analysis/control circuit 520 outputs a first amplifier control signal 522 to the first amplifier 530 directing the first amplifier to maintain or adjust its present gain (e.g., maintain or adjust a number of bits in the representation and/or the magnitudes that the bits represent), outputting a gain-adjusted signal 504. The analysis/control circuit 520 also outputs a first range shifter control signal 523 to the first range shifter 550 directing the first range shifter 550 to shift the range of the digital representation of the signal 504. The first range shifter 550 then outputs the resulting range-shifted signal 512. The gain-adjusted signal 504 is illustrated at graph 610, and the range-shifted signal 512 is illustrated at graph 620. As shown at graph 620 compared to graph 610, in general, the zero crossings have been eliminated, and thus energy wasted on unnecessary bit state transitions associated with zero crossings may be eliminated and/or substantially reduced. In an example scenario, for example in which a sign bit will not or should not change, the sign bit (or most significant bits) may be locked. Note that as discussed previously, the number of zero crossings expected for a particular type of digital representation may also depend on the nature of the processing to be performed by the digital processing circuit 510. In other words, just because the range-shifted signal 512 input to the digital processing circuit 510 is free of zero crossings, this does not mean that zero crossings cannot occur during processing by the digital processing circuit 510.

Continuing the example, the range-shifted signal 512 from the first range shifter 550 as shown in graph 620 is input to the digital processing circuit 510. In this example, the digital processing circuit 510 may comprise a digital filtering circuit. As with the control signals 522 and 524 output to the first amplifier 530 and first range shifter 550, the analysis/control circuit 520 may also output a processing control signal 524 to the digital processing circuit 510. The processing control signal 524 may, for example, notify the digital processing circuit 510 of the shift in the range of the digital representation of the signal 512 input to the digital processing circuit 510. In such a scenario, the digital processing circuit 510 may adjust filter settings to compensate for the shifted range of the signal 512. In another scenario, the processing control signal 524 may specify the filter coefficients that the digital processing circuit 510 is to utilize. In a further scenario, the processing control signal 524 may comprise memory address information of a particular processing subroutine that is to be executed by the digital processing circuit 520 to perform its processing.

After processing the range-shifted signal 512 input to the digital processing circuit 510, the digital processing circuit 510 may output a processed signal 514 comprising the results of the digital processing. An example of the processed signal 514 is shown at graph 630, which is generally in the same range as the range-shifted signal 512 input to the digital processing circuit 510. As discussed above, note that the processed signal 514 may have zero crossings, albeit at a reduced frequency than if the range-shifting had not been performed by the first range shifter 550. The processed signal 514 is provided as an input to the second range shifter 560. The second range shifter 560 may then, for example, reverse the change in digital representation that was performed by the first range shifter 550. For example, the second range shifter 560 may return the digital representation of the processed signal 514 to the range corresponding to the original input signal 502. The analysis/control circuit 520 may, for example, output a second range shifter control signal 525 to the second range shifter 560 directing the second range shifter 560 to return the range location of the digital representation of the processed signal 514 to the original range location prior to the shift performed by the first range shifter 550. Such a signal change may, for example, be desirable for subsequent circuitry that does not have the power-save capability of the circuitry presented herein. For example, particular types of downstream signal processing circuitry, for example various non-linear IIR circuitry, might be provided with a signal represented in an original format for which the circuitry was designed. The second range shifter 560 may then output the range-shift-restored signal 506. An example of the range-shift-restored signal 506 is shown at graph 640, which is represented in a digital representation that uses the same range location as the input signal 502 to the circuit 500.

The range-shift-restored signal 506 is then input to the second amplifier 540. The second amplifier 540 may, for example, reverse the change (if any) in digital representation that was performed by the first amplifier 530. For example, the second amplifier 540 may return gain that was previously removed by the first amplifier 530. The analysis/control circuit 520 may, for example, output a second amplifier control signal 526 to the second amplifier 540 directing the second amplifier 540 to return the gain that was previously removed (or for example return the modified discrete scaling to the original scaling). Such a signal change may, for example, be desirable for subsequent circuitry that does not have the power-save capability of the circuitry presented herein. For example, particular types of signal processing circuitry, for example various non-linear IIR circuitry, might be provided with a signal represented in an original format for which the circuitry was designed. The second amplifier 540 then outputs the gain-restored signal 508.

The example just discussed generally included changing the dynamic range location of the digital representation used to digitally represent a signal being processed, for example to reduce the number of bit state transitions occurring during digital processing. Additionally, the example also included changing the magnitude of the dynamic range of the input signal to reduce the number of bits representing the input signal and thus minimize bit state transitions during the digital processing. It should be noted that any combination of one or more of the power-saving techniques presented herein, or the like, may be arranged and performed together, in a parallel fashion and/or serially. It should also be noted that any of techniques discussed herein for power-saving may be performed during initial digitization of a signal, such that a conversion between digital formats might not be necessary.

It should also be noted that the digital representation conversions discussed herein, in particular after the digital processing, may be performed regardless of whether a digital representation conversion was performed prior to the digital processing. For example, as mentioned above, an initial digitization of an analog signal might be performed prior to digital processing without a conversion between digital representations. The digitized signal may then be digitally processed, and the digitally-processed signal converted to another digital representation, for example converted to a digital representation that is advantageous for subsequent circuitry (e.g., in a power-saving sense, in a U/I sense, etc.). For example, in an exemplary scenario, the initial digitization may be consistent rather than flexible, for example followed by a known consistent and/or flexible subsequent digitation.

Figure 7:
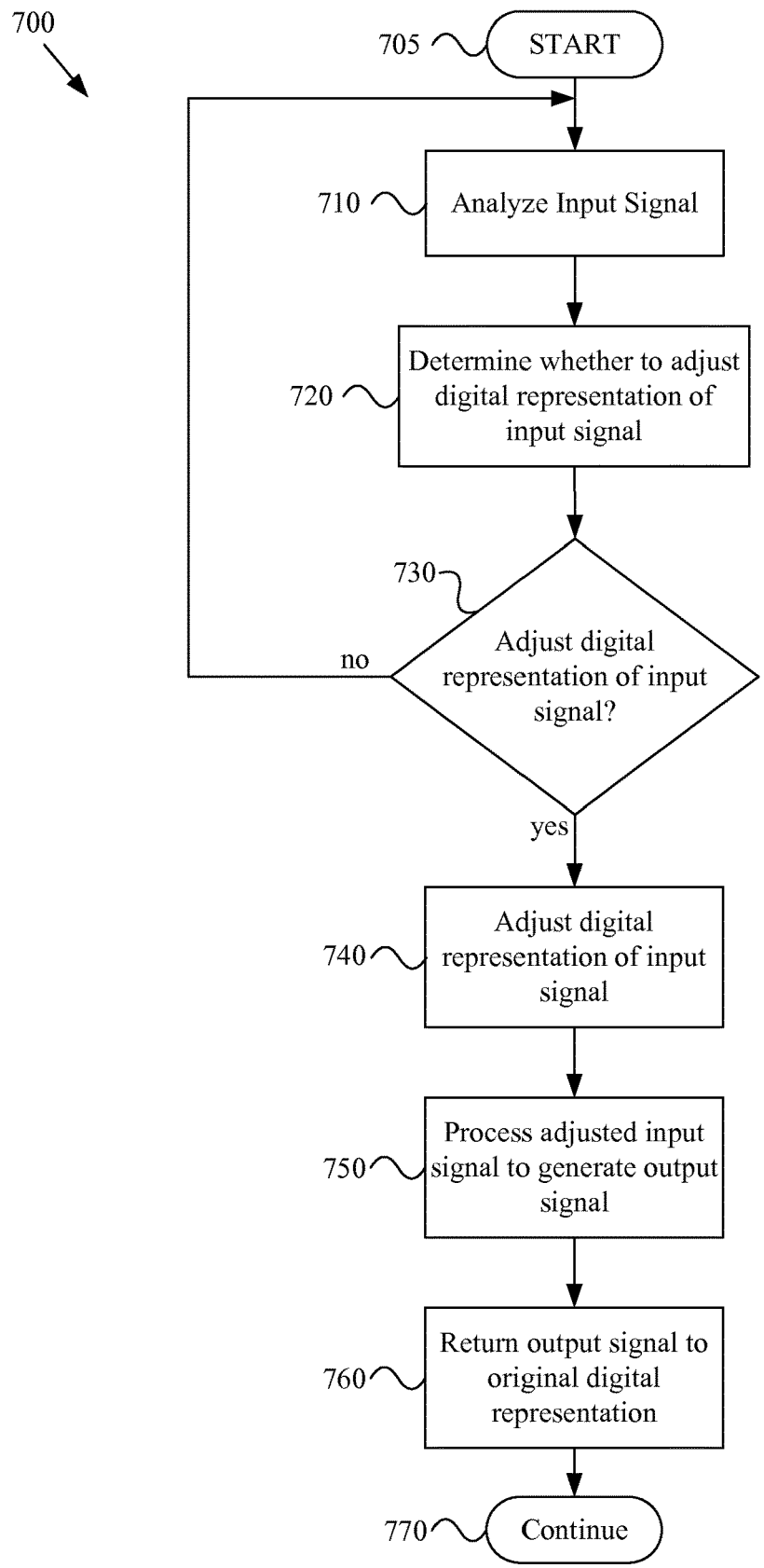
FIG. 7 shows a flow diagram illustrating an example method for adjusting representation and/or characterization of an input signal for reducing power consumption, in accordance with various aspects of the disclosure.

Turning next to FIG. 7, such figure shows a flow diagram 700 illustrating an example method for adjusting representation and/or characterization of an input signal for reducing power consumption, in accordance with various aspects of the disclosure. The method 700 may, for example, share any or all functional characteristics discussed herein with regard to the circuits 100, 300, and 500 illustrated in FIGS. 1-6 and discussed previously, and vice versa.

The method 700 begins executing at step 705. The method 700 may begin executing in response to any of a variety of causes and/or conditions. For example, the method 700 may begin executing in response to arrival of an input signal to process, the beginning of an overall communication, at the outset of a packet exchange, etc. Also for example, the method 700 may begin executing in response to a user input indicating a desire to operate in a power-saving mode associated with the method 700. Also for example, the method 700 may begin executing in response to a detected power source conditions, for example a detected low-battery condition. Additionally for example, the method 700 may execute periodically on a timed basis. In general, the method 700 may begin executing in response to any of a variety of causes and/or conditions. Accordingly, the scope of various aspects of this disclosure should not be limited by characteristics of any particular initiating causes and/or conditions.

The method 700 may, for example at step 710, comprise analyzing an input signal and/or any of a variety of other signals, for example to determine a signal quality level. Step 710 may, for example, share any or all functional characteristics with the analysis/control circuits 120, 320, and 520 discussed herein. Step 710 may, for example, comprise ascertaining the quality of the input signal (e.g., SNR, error rate, blocking signal identification, eye pattern characteristics, etc.). Such analysis may, for example, be performed directly on the input signal, and may also comprise receiving quality information from other circuitry that is not directly involved with performing the method 700.

The method 700 may, for example at step 720, comprise determining, for example based at least in part on the analysis performed at step 710, whether to adjust a first digital representation of the input signal (e.g., a level thereof) to a second digital representation different from the first digital representation. For example, step 720 may comprise performing such a determination prior to a next digital signal processing function to be performed on the input signal. Step 720 may, for example, share any or all functional characteristics with the analysis/control circuits 120, 320, and 520 discussed previously. Note that step 720 may comprise performing such determining based on power consumption estimation and/or prior experience. For example, it may be determined during end use operation of circuitry which of the power-saving strategies discussed herein works the best in a given situation. In such a scenario, information of past monitored power-saving performance may be utilized in determining a power-saving strategy to perform. Such operation may, for example be performed by any or all of the analysis/control circuits 120, 320, and 520 discussed previously.

The method 700 may, for example at step 730, comprise directing execution flow of the method 700. For example, if it is determined at step 720 that no adjustment to the digital representation should be made, then execution flow of the method 700 may loop back up to step 710 for continued monitoring and/or analysis. Also for example, if it is determined at step 720 that an adjustment to the digital representation should be made, then execution flow of the method 700 may continue to step 740.

The method 700 may, for example at step 740, comprise adjusting the digital representation of the input signal (e.g., levels thereof). Step 740 may, for example, share any or all functional characteristics with the first amplifiers (or attenuators) 130, 330, and 530 discussed herein. For example, step 740 may comprise adjusting a magnitude of the dynamic range of the input signal and/or number of bits representing the input signal. Step 740 may also, for example, share any or all functional characteristics with the first range shifter 550 discussed herein. For example, step 740 may comprise shifting the dynamic range of the input signal and/or applying a DC offset to the input signal. Additionally, for example, step 740 may share any or all functional characteristics with the first number representation converter 350 discussed herein. For example, step 740 may comprise changing a fundamental type of digital representation used to represent the input signal. In general, step 740 may comprise adjusting the digital representation of the input signal. Accordingly, the scope of various aspects of this disclosure should not be limited by characteristics of any particular manner of making such an adjustment.

The method 700 may, for example at step 750, comprise digitally processing the input signal adjusted at step 740. Step 750 may, for example, share any or all functional characteristics with the digital processing circuits 110, 310, and 510 discussed herein. For example, step 750 may comprise performing mathematical processing, general logical processing, general data processing, digital filtering (e.g., FIR and/or IIR filtering), etc.

The method 700 may, for example at step 760, comprise reversing (or backing out) any one or more digital representation adjustments performed at step 740. Step 760 may, for example, share any or all functional characteristics with the second amplifiers (or attenuators) 140, 340, and 540 discussed herein. For example, step 760 may comprise reversing the adjustment of a magnitude of the dynamic range of the input signal and/or number of bits representing the input signal performed at step 740. Step 760 may also, for example, share any or all functional characteristics with the second range shifter 560 discussed herein. For example, step 760 may comprise reversing a dynamic range of the input signal and/or the applying of a DC offset to the input signal performed at step 740. Additionally, for example, step 760 may share any or all functional characteristics with the second number representation converter 360 discussed herein. For example, step 760 may comprise reversing a change in the fundamental type of digital representation used to represent the input signal performed at step 740. In general, step 760 may comprise reversing an adjustment made to the digital representation of the input signal, for example performed at step 740. Accordingly, the scope of various aspects of this disclosure should not be limited by characteristics of any particular manner of making such an adjustment.

The method 700 may, for example at step 770, comprise performing continued processing. Step 770 may comprise performing any of a variety of different types of continued processing. For example, step 770 may comprise looping execution flow of the method 700 to any previous step. Also for example, step 770 may comprise providing an output signal from step 760 to further circuitry. Additionally for example, step 770 may comprise assessing performance of the method 700 and making responsive adjustments to the method 700.

Step 770 may also, for example, comprise performing additional power-saving functions. For example, various bits in a digital representation of a signal may be forced to a logical 1 or 0. Also for example, step 770 may comprise scaling circuit supply voltages (e.g., supply voltages that supply multipliers, adders, filters, etc.) in the digital processing circuit that processes the adjusted input signal. Any or all of such additional power-saving functions may also, for example, be performed by any or the circuits 100, 300, and 500 discussed herein, for example at least in part by processors executing software instructions.

Step 770 may also, for example, comprise performing a next set of signal processing functions (e.g., non-linear signal processing functions) and then looping back up to steps 710 and 720 when such next processing is completed for repeating the power-save operation for another circuit.

Figure 8A:
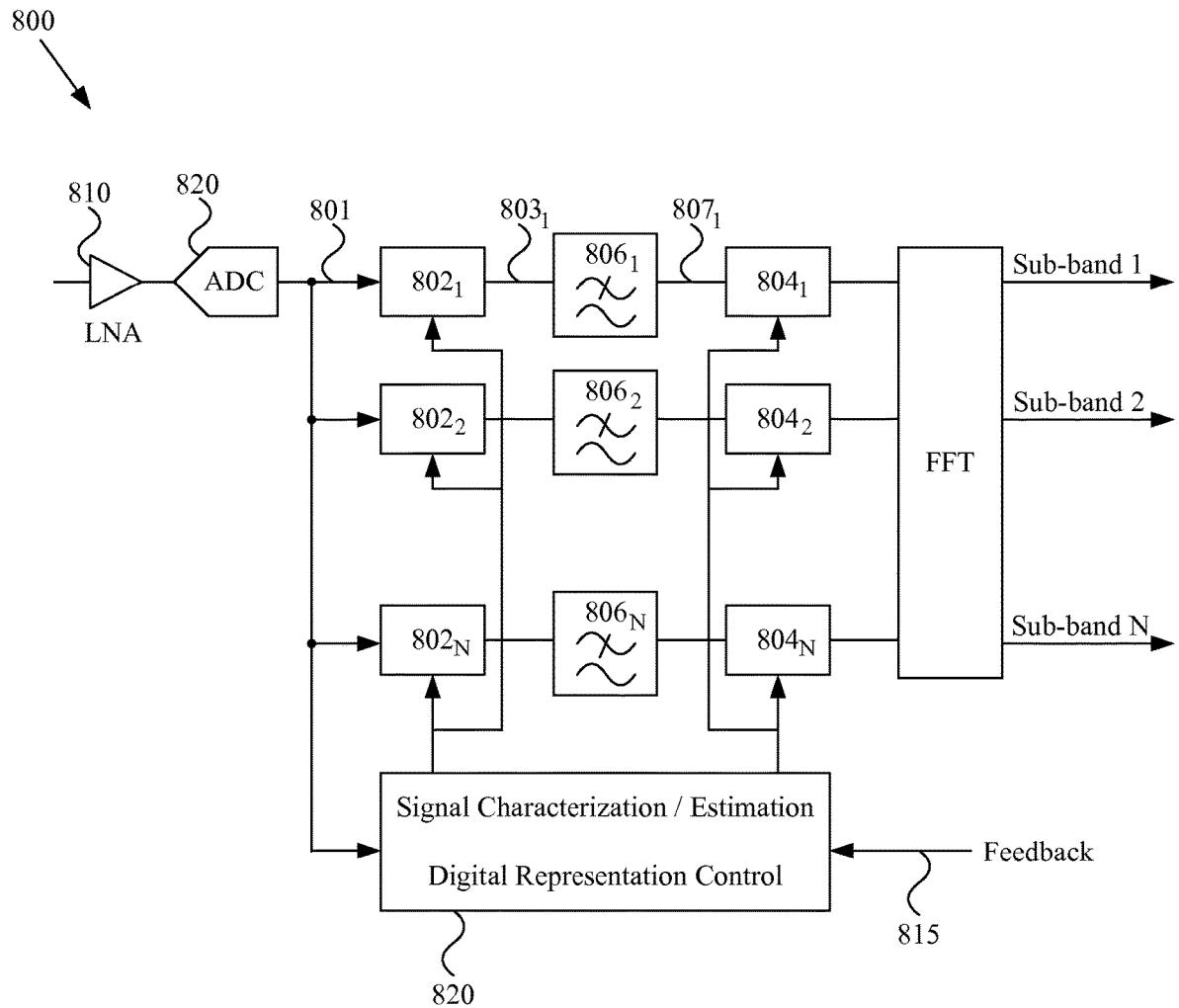
FIG. 8A is a diagram illustrating a portion of a low-power receiver, in accordance with various aspects of the disclosure.

Turning next to FIG. 8A, such figure is a diagram illustrating a portion of a low-power receiver 800, in accordance with various aspects of the disclosure. Each of N filters 806 (e.g., polyphase filters for selecting channels of a received television spectrum) of a receiver 800 may be preceded by a circuit 802 and succeeded by a circuit 804. Each circuit 802 may perform gain control similar to the gain elements 130, 330, and/or 530 of FIGS. 1-6, may perform digital representation conversion similar to the circuit 350 of FIGS. 3-4, and/or add a DC bias similar to the circuit 550 of FIGS. 5-6. Each circuit 804 may perform gain control similar to the gain elements 140, 340, and/or 540 of FIGS. 1-6, may perform digital representation conversion similar to the circuits 360 of FIG. 3, and/or add a DC bias similar to the circuit 560 of FIGS. 5-6. In an example implementation, each filter 806 may be an instance of the FIR filter shown in FIG. 8B.

Figure 8B:
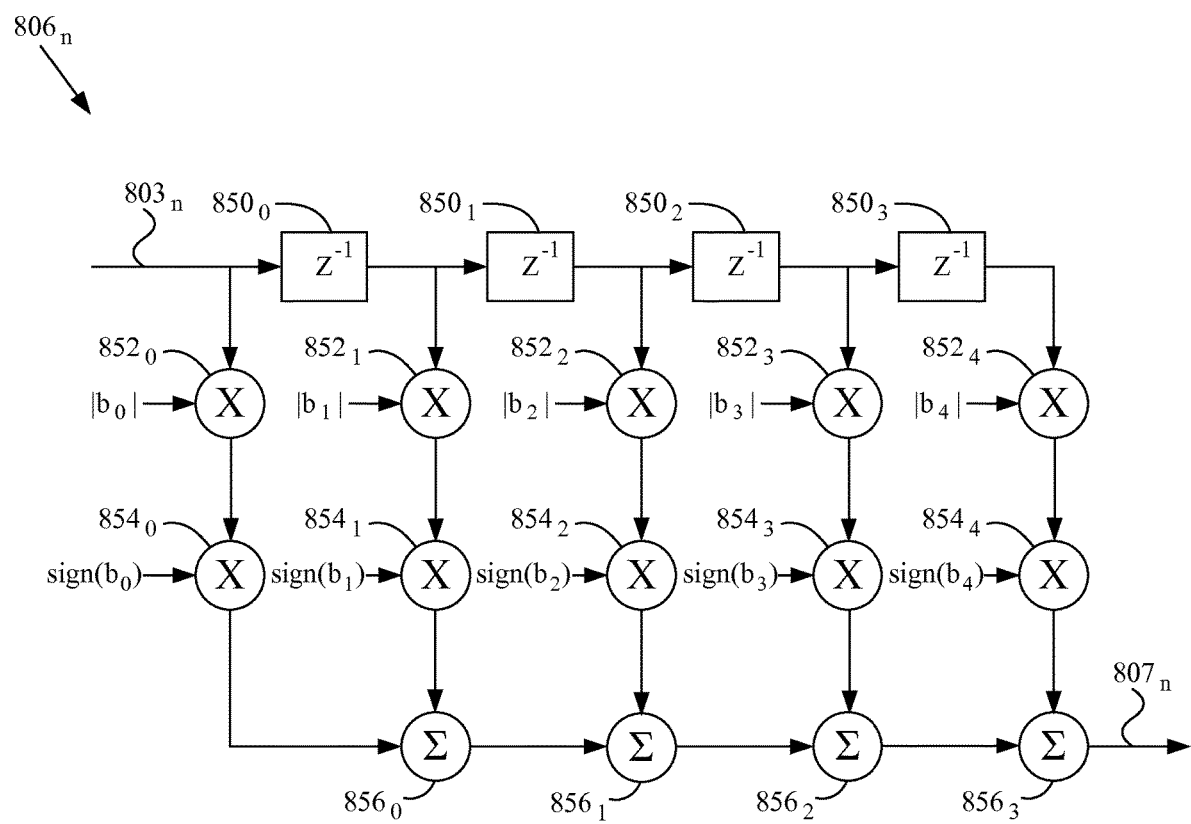
FIG. 8B is a diagram illustrating an example of a low-power digital filter, in accordance with various aspects of the disclosure.

Turning next to FIG. 8B, such figure is a diagram illustrating an example of a low-power digital filter 806, in accordance with various aspects of the disclosure. The example FIR filter 806 comprises delay elements $850_0$-$850_3$, multipliers $852_0$-$852_4$, multipliers $854_0$-$854_4$, and summers $856_0$-$856_3$. The multipliers 852 may multiply their respective inputs by the magnitude of the respective tap coefficient. In a scenario in which samples of the input signal 803 are always positive as a result of the added DC bias, the multiplications by the magnitude of the tap coefficients will always result in positive numbers, thus eliminating power consumption that would result from a negative coefficient resulting in large numbers of bits toggling state due to, for example, a two's complement representation. Then, after the signals have been scaled by multipliers 852, each of the resulting signals may be multiplied by the sign of its respective tap coefficient, for example using second multipliers 854. In this manner, sign inversion takes place at most once for each tap, for example the sign inversion occurs for the taps having a negative coefficient, and overall bit toggling may be reduced as compared to directly multiplying by the negative coefficient. The outputs of multipliers 854 are then summed by summers 856 and output as signal 807.

The examples presented herein have generally been discussed in terms of functional circuits, which may alternatively be referred to as modules. Such circuits or modules may, for example, comprise electrical hardware. Such circuits or modules may, for example, comprise a combination of hardware and software. Though the discussion herein has been segmented in terms of discrete circuits (or modules), such segmentation was chosen for illustrative clarity and not for limitation. For example, the scope of various aspects of this disclosure should not be limited by arbitrary notions of boundaries between modules. For example any of the circuits (or modules) discussed herein may share hardware and/or software. For example a common processor may be used by many of the circuits (or modules) discussed herein. Similarly for example, a common software routine may also be shared by many of the circuits (or modules).

As discussed above, any one or more of the circuits and/or functions discussed herein may be implemented by a processor executing software instructions. Similarly, other embodiments may comprise or provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

In summary, various aspects of the present disclosure provide systems and methods for low-power digital signal processing. While the invention has been described with reference to certain aspects and embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment(s) disclosed, but that the invention will include all embodiments falling within the scope of the appended claims.

What is claimed is:

1. A low-power digital processing circuit comprising:
at least one module operable to, at least:
receive a first signal, where a level of the first signal is represented by a first type of digital representation;
generate a second signal by, at least in part, representing the level of the received first signal by a second type of digital representation different from the first type of digital representation;
generate a third signal by at least in part filtering the second signal; and
generate a fourth signal by, at least in part, representing a level of the third signal by the first type of digital representation,
wherein the at least one module is operable to represent the level of the received first signal by the second type of digital representation by, at least in part, operating to add a DC offset to the level of the first signal represented by the first type of digital representation.

2. The low-power digital processing circuit of claim 1, wherein the digital processing circuit comprises a digital receiver.

3. A low-power digital processing circuit comprising:
at least one module operable to, at least:
receive a first signal, where a level of the first signal is represented by a first type of digital representation;
generate a second signal by, at least in part, representing the level of the received first signal by a second type of digital representation different from the first type of digital representation;
generate a third signal by at least in part filtering the second signal; and
generate a fourth signal by, at least in part, representing a level of the third signal by the first type of digital representation,
wherein the at least one module is operable to represent the level of the received first signal by the second type of digital representation by, at least in part, operating to multiply the level of the first signal represented by the first type of digital representation by a gain value.

4. A low-power digital processing circuit comprising:
at least one module operable to, at least:
receive a first signal, where a level of the first signal is represented by a first type of digital representation;
generate a second signal by, at least in part, representing the level of the received first signal by a second type of digital representation different from the first type of digital representation;
generate a third signal by at least in part filtering the second signal; and
generate a fourth signal by, at least in part, representing a level of the third signal by the first type of digital representation,
wherein the at least one module is operable to generate a sub-band signal by, at least in part, operating to perform a Fast Fourier Transform (FFT) operation on the fourth signal.

5. A low-power digital processing circuit comprising:
at least one module operable to, at least:
receive a first signal, where a level of the first signal is represented by a first type of digital representation;
generate a second signal by, at least in part, representing the level of the received first signal by a second type of digital representation different from the first type of digital representation;

generate a third signal by at least in part filtering the second signal; and generate a fourth signal by, at least in part, representing a level of the third signal by the first type of digital representation;

generate a fifth signal by at least in part representing the level of the received first signal by a third type of digital representation different from the first type of digital representation;

generate a sixth signal by, at least in part, filtering the fifth signal; and generate a seventh signal by, at least in part, representing the level of the sixth signal by the first type of digital representation.

6. The low-power digital receiver of claim 5, wherein the at least one module is operable to generate a second sub-band signal by, at least in part, operating to perform a Fast Fourier Transform (FFT) operation on the seventh signal.

7. The low-power digital receiver of claim 5, wherein the at least one module is operable to generate the second signal and to generate the fifth signal simultaneously.

8. A low-power digital processing circuit comprising:
at least one module operable to, at least:
receive a first signal, where a level of the first signal is represented by a first type of digital representation;
generate a second signal by at least in part first adjusting the first type of digital representation of the level of the first signal to a second type of digital representation, wherein said first adjusting comprises adding a first DC offset;
generate a third signal by at least in part filtering the second signal; and
generate a fourth signal by, at least in part, representing a level of the third signal by the first type of digital representation.

9. The low-power digital processing circuit of claim 8, wherein the second type of digital representation is the first type of digital representation adjusted by the first DC offset.

10. The low-power digital processing circuit of claim 8, wherein the at least one module operates to filter the second signal by, at least in part, operating to:
first multiply the second signal by a first magnitude of a first tap coefficient to generate a first product signal; and
after the first multiplying, incorporate a sign of the first tap coefficient into the first product signal to generate a first signed product signal.

11. The low-power digital processing circuit of claim 10, wherein the at least one module operates to filter the second signal by, at least in part, operating to:
time-shift the second signal;
second multiply the time-shifted second signal by a second magnitude of a second tap coefficient to generate a second product signal;
after the second multiplying, incorporate a sign of the second tap coefficient into the second product signal to generate a second signed product signal; and
add the second signed product signal to the first signed product signal.

12. The low-power digital processing circuit of claim 8, wherein the first DC offset is large enough to ensure that all levels of the second type of digital representation of the level of the first signal are non-negative.

13. A low-power digital processing circuit comprising:
at least one module operable to, at least:
receive a first signal, where a level of the first signal is represented by a first type of digital representation;

generate a second signal by, at least in part, representing the level of the received first signal by a second type of digital representation different from the first type of digital representation;
generate a third signal by, at least in part, performing a digital signal processing function on the second signal; and
generate a fourth signal by, at least in part, representing a level of the third signal by the first type of digital representation,
wherein the at least one module is operable to represent the level of the received first signal by the second type of digital representation by, at least in part, operating to:
add a DC offset to the level of the first signal represented by the first type of digital representation; and/or
multiply the level of the first signal represented by the first type of digital representation by a gain value.

14. A low-power digital processing circuit comprising:
at least one module operable to, at least:
receive a first signal, where a level of the first signal is represented by a first type of digital representation;
generate a second signal by, at least in part, representing the level of the received first signal by a second type of digital representation different from the first type of digital representation;
generate a third signal by, at least in part, performing a digital signal processing function on the second signal; and
generate a fourth signal by, at least in part, representing a level of the third signal by the first type of digital representation,
wherein the at least one module is operable to generate a sub-band signal by, at least in part, operating to perform a Fast Fourier Transform (FFT) operation on the fourth signal.

15. A low-power digital processing circuit comprising:
at least one module operable to, at least:
receive a first signal, where a level of the first signal is represented by a first type of digital representation;
generate a second signal by, at least in part, representing the level of the received first signal by a second type of digital representation different from the first type of digital representation;
generate a third signal by, at least in part, performing a digital signal processing function on the second signal; and
generate a fourth signal by, at least in part, representing a level of the third signal by the first type of digital representation,
wherein the at least one module is operable to perform the digital signal processing function on the second signal by, at least in part, operating to:
first multiply the second signal by a first magnitude of a first tap coefficient to generate a first product signal; and
after the first multiplying, incorporate a sign of the first tap coefficient into the first product signal to generate a first signed product signal.

16. A low-power digital processing circuit comprising:
at least one module operable to, at least:
receive a first signal, where a level of the first signal is represented by a first type of digital representation;
generate a second signal by, at least in part, representing the level of the received first signal by a second type of digital representation different from the first type of digital representation;

generate a third signal by, at least in part, performing a digital signal processing function on the second signal;

generate a fourth signal by, at least in part, representing a level of the third signal by the first type of digital representation;

generate a fifth signal by, at least in part, representing the level of the received first signal by a third type of digital representation different from the first type of digital representation;

generate a sixth signal by, at least in part, performing a digital signal processing function on the fifth signal; and generate a seventh signal by, at least in part, representing the level of the sixth signal by the first type of digital representation.

17. The low-power digital receiver of claim 16, wherein the third digital representation is different from the second digital representation.

18. The low-power digital receiver of claim 16, wherein the at least one module is operable to generate a second sub-band signal by, at least in part, operating to perform a Fast Fourier Transform (FFT) operation on the seventh signal.

\* \* \* \* \*